United States Patent  
Yi et al.

(10) Patent No.: US 8,652,967 B2
(45) Date of Patent: Feb. 18, 2014

(54) ADJUVANT FOR CONTROLLING POLISHING SELECTIVITY AND CHEMICAL MECHANICAL POLISHING SLURRY COMPRISING THE SAME

(75) Inventors: Gi Ra Yi, Daejeon (KR); Jong Pil Kim, Daejeon (KR); Jung Hee Lee, Gwacheon-si (KR); Kwang Ik Moon, Daejeon (KR); Chang Bum Ko, Daejeon (KR); Soon Ho Jang, Seoul (KR); Seung Beom Cho, Daejeon (KR); Young Jun Hong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/420,815

(22) Filed: Mar. 15, 2012

(65) Prior Publication Data

US 2012/0187333 A1  Jul. 26, 2012

Related U.S. Application Data

(62) Division of application No. 11/634,238, filed on Dec. 6, 2006, now Pat. No. 8,163,650.

(30) Foreign Application Priority Data

Dec. 8, 2005 (KR) ................ 2005-119532

(51) Int. Cl.
*H01L 21/302* (2006.01)
(52) U.S. Cl.
USPC ........ 438/691; 252/79.1; 252/79.2; 252/79.3; 252/79.4; 438/424; 438/689; 438/690
(58) Field of Classification Search
USPC ............. 252/79.1–79.4; 438/424, 689–692
See application file for complete search history.

(56) References Cited

U.S. PATENT DOCUMENTS

| | | | |
|---|---|---|---|
| 5,614,444 | A | 3/1997 | Farkas et al. |
| 6,723,143 | B2 | 4/2004 | Towery et al. |
| 6,776,810 | B1 | 8/2004 | Cherian et al. |
| 6,824,579 | B2 | 11/2004 | Ronay |
| 6,964,923 | B1 | 11/2005 | Ronay |
| 2002/0023389 | A1 | 2/2002 | Minamihaba et al. |
| 2003/0032371 | A1 | 2/2003 | Weinstein et al. |

(Continued)

FOREIGN PATENT DOCUMENTS

| | | |
|---|---|---|
| EP | 0322-721 | * 12/1988 |
| EP | 0 322 721 | 7/1989 |

(Continued)

*Primary Examiner* — Nadine G Norton
*Assistant Examiner* — Maki Angadi
(74) *Attorney, Agent, or Firm* — McKenna Long & Aldridge, LLP

(57) ABSTRACT

Disclosed is an adjuvant for use in simultaneous polishing of a cationically charged material and an anionically charged material, wherein the adjuvant comprises a polyelectrolyte salt containing: (a) a mixture of a linear polyelectrolyte having a weight average molecular weight of 2,000~50,000 with a graft type polyelectrolyte that has a weight average molecular weight of 1,000~20,000 and comprises a backbone and a side chain; and (b) a basic material. CMP (chemical mechanical polishing) slurry comprising the above adjuvant and abrasive particles is also disclosed. The adjuvant comprising a mixture of a linear polyelectrolyte with a graft type polyelectrolyte makes it possible to increase polishing selectivity as compared to CMP slurry using the linear polyelectrolyte alone, and to obtain a desired range of polishing selectivity by controlling the ratio of the linear polyelectrolyte to the graft type polyelectrolyte.

4 Claims, 1 Drawing Sheet

(56) References Cited

U.S. PATENT DOCUMENTS

| | | |
|---|---|---|
| 2003/0092265 A1* | 5/2003 | Kim et al. .................... 438/689 |
| 2003/0124957 A1 | 7/2003 | Kobayashi et al. |
| 2003/0159362 A1 | 8/2003 | Singh et al. |
| 2004/0033764 A1 | 2/2004 | Lee et al. |
| 2004/0060472 A1 | 4/2004 | Ronay |
| 2004/0162011 A1 | 8/2004 | Konno et al. |
| 2006/0000150 A1 | 1/2006 | Kelly et al. |
| 2006/0108326 A1 | 5/2006 | Dysard et al. |
| 2006/0141741 A1 | 6/2006 | Yi et al. |

FOREIGN PATENT DOCUMENTS

| | | |
|---|---|---|
| EP | 1 036 836 B1 | 9/2000 |
| JP | H10-106988 | 4/1998 |
| JP | H10-154672 | 6/1998 |
| JP | H10-270401 | 10/1998 |
| JP | 2000-109807 | 4/2000 |
| JP | 2001-035820 | 2/2001 |
| JP | 2001-037951 | 2/2001 |
| JP | 2001-319900 | 11/2001 |
| JP | 2002-030271 | 1/2002 |
| KR | 1020010108048 A | 12/2001 |
| KR | 1020020015697 A | 2/2002 |
| KR | 1020030039999 A | 5/2003 |
| KR | 1020040013299 A | 2/2004 |
| KR | 1020040057653 A | 7/2004 |
| KR | 10-20040095118 A | 11/2004 |
| KR | 10-20040098671 A | 11/2004 |
| KR | 10 20050004051 A | 1/2005 |
| TW | 1241339 | 10/2003 |

* cited by examiner

ADJUVANT FOR CONTROLLING POLISHING SELECTIVITY AND CHEMICAL MECHANICAL POLISHING SLURRY COMPRISING THE SAME

This application is a divisional application of U.S. patent application Ser. No. 11/634,238, filed on Dec. 6, 2006 now U.S. Pat. No. 8,163,650, which claims the benefit of Korean Patent Application No. 2005-119532, filed on Dec. 8, 2005, in the Korean Intellectual Property Office, both of which are incorporated herein in their entireties by reference.

TECHNICAL FIELD

The present invention relates to an adjuvant for controlling polishing selectivity and CMP (chemical mechanical polishing) slurry comprising the same.

BACKGROUND ART

As microelectronic devices have been continuously provided with a larger integration scale, planarization processes used for manufacturing such microelectronic devices have become more and more important. As a part of efforts to obtain very large scale integrated microelectronic devices, multiple interconnection technique and multilayer stacking technique have generally been used for semiconductor wafers. However, non-planarization occurring after carrying out one of the above techniques causes many problems. Therefore, planarization processes are applied to various steps in a microelectronic device manufacturing process, so as to minimize irregularity on wafer surfaces.

One of these planarization techniques is CMP (chemical mechanical polishing). During the process of CMP, a wafer surface is pressed against a polishing pad that rotates relative to the surface, and a chemical reagent known as CMP slurry is introduced into the polishing pad during the polishing process. Such CMP technique accomplishes planarization of a wafer surface by way of chemical and physical actions. In other words, CMP technique accomplishes planarization of a wafer surface by pressing the wafer surface against the polishing pad that rotates relative to the surface, and by supplying a chemically active slurry to the wafer surface having a pattern at the same time.

One embodiment, to which CMP technique is applied, is STI (shallow trench isolation). The STI process has been recently developed so as to solve the problem occurring in the conventional LOCOS (local oxidation of silicon) processes and to make electric insulation between chips. This is because the conventional LOCOS processes cause the problem of a so-called Bird's Beak phenomenon, while minimum line width standard becomes more strict to a degree of 0.13 μm or less. In the STI technique, relatively shallow trenches are formed, and such trenches are used in forming field regions for separating active regions on wafer surfaces.

As shown in FIG. 1, in the STI process, a pad silicon oxide ($SiO_2$) layer 101 and a silicon nitride (SiN) layer 102 are formed successively on a semiconductor wafer. Next, a photoresist pattern is formed on the SiN layer 102. Then, the SiN layer 102, the pad silicon oxide layer 101 and the semiconductor wafer 100 are partially etched by using the photoresist pattern as a mask, so that a plurality of trenches 103 is formed.

Further, in order to form field regions, an insulating silicon oxide layer 104 is deposited by way of LPCVD (low pressure chemical vapor deposition), PECVD (plasma enhanced chemical vapor deposition) or HDPCVD (high density plasma chemical vapor deposition) technique, so that the trenches 103 are filled with the layer 104 and the surface of the SiN layer 102 is covered with the layer 104.

Subsequently, the insulating silicon oxide layer 104 is polished until the SiN layer 102 is exposed. Additionally, the SiN layer 102 placed between two adjacent active regions, as well as the pad silicon oxide layer 101 is removed by etching. Finally, a gate silicon oxide layer 105 is formed on the surface of the semiconductor wafer.

Herein, during the progress of the CMP process for removing the insulating silicon oxide layer 104, the insulating silicon oxide layer 104 and the SiN layer 102 show different removal rates due to their different chemical and physical properties.

The ratio of the removal rate of the insulating silicon oxide layer to that of the silicon nitride layer is referred to as the selectivity of CMP slurry.

As the selectivity of CMP slurry decreases, the amount of the SiN layer removed by the slurry, increases. It is preferable that the SiN layer is not removed. In other words, preferably the selectivity of the insulating silicon oxide layer to the SiN layer is more than 30:1. However, conventional CMP slurry has a low polishing selectivity of the insulating silicon oxide layer to the SiN layer, which is about 4:1. Hence, the SiN layer is polished to a degree exceeding the acceptable range in a practical CMP process.

As a result, the SiN layer pattern may be removed non-uniformly depending on locations in a wafer during a CMP process. Therefore, the SiN layer has a variable thickness over the whole wafer. Particularly, this is a serious problem in the case of a semiconductor wafer that has a highly dense pattern simultaneously with a sparse pattern.

Due to the above-mentioned problem, a final structure having field regions has a level difference between active regions and field regions, resulting in reduction of the margin of subsequent steps for manufacturing a semiconductor device, and degradation of the quality of a transistor and a device. Briefly, conventional CMP processes are problematic in that a SiN layer pattern with a uniform thickness cannot be obtained even after removing the oxide layer via a CMP process.

To solve the problem, many attempts have been made recently to develop a slurry composition that can control the removal rate of the insulating silicon oxide layer to be higher than the polishing rate of the SiN layer. For example, such slurry composition is disclosed in U.S. Pat. No. 5,614,444; Japanese Laid-Open Patent Nos. 1998-106988, 1998-154672, 1998-270401, 2001-37951, 2001-35820 and 2001-319900; and Korean Laid-Open Patent Nos. 2001-108048, 2002-0015697, 2003-0039999, 2004-0057653, 2004-0013299 and 2003-0039999.

However, such techniques according to the prior art are problematic in that their application ranges are too broad and are not clearly defined, and merely provide basic information about polishing rates and selectivity ratios. Therefore, such techniques are not practically applicable.

In addition to the above, domestic semiconductor and slurry fabricating companies have developed an additive for increasing the polishing selectivity of cerium oxide slurry, the additive comprising a linear polymer alone or in combination with a low-molecular weight material. Such additives are disclosed in Korean Laid-Open Patent Nos. 2003-0039999, 2004-0098671, 2004-0095118 and 2005-0004051.

As described above, intensive research and development into CMP slurry compositions have been made continuously up to date in order to improve the selectivity expressed by the ratio of the polishing rate of an insulating silicon oxide layer to that of a SiN layer. However, such slurry compositions still have much room for improvement.

DISCLOSURE OF THE INVENTION

It is an object of the present invention to provide an adjuvant for use in simultaneous polishing of a structure of a cationically charged material, such as a nitride layer, and a structure of an anionically charged material, such as an oxide layer, the adjuvant forming an adsorption layer on a structure of the cationically charged material in order to increase the polishing selectivity of the structure of the anionically charged material. The present invention adopts a combination of a linear polyelectrolyte having a weight average molecular weight of 2,000~50,000 with a graft type polyelectrolyte (ionic polymer or macroion) having a weight average molecular weight controlled to 1,000~20,000. According to the adjuvant of the present invention, it is possible to increase polishing selectivity as compared to the adjuvant comprising a linear polyelectrolyte alone. It is also possible to obtain a desired range of polishing selectivity by adjusting the ratio of the linear polyelectrolyte to the graft type polyelectrolyte.

According to an aspect of the present invention, there is provided an adjuvant for use in simultaneous polishing of a cationically charged material and an anionically charged material, which forms an adsorption layer on the cationically charged material in order to increase the polishing selectivity of the anionically charged material, the adjuvant comprising a polyelectrolyte salt containing: (a) a mixture of a linear polyelectrolyte having a weight average molecular weight of 2,000~50,000 with a graft type polyelectrolyte that has a weight average molecular weight of 1,000~20,000 and comprises a backbone and a side chain; and (b) a basic material. CMP slurry comprising the same adjuvant and abrasive particles is also provided.

According to another aspect of the present invention, there is provided an adjuvant for CMP slurry, which comprises a polyelectrolyte salt containing: (a) a mixture of a linear polyelectrolyte having a weight average molecular weight of 2,000~50,000 with a graft type polyelectrolyte that has a weight average molecular weight of 1,000~20,000 and comprises a backbone and a side chain; and (b) a basic material. CMP slurry comprising the same adjuvant and abrasive particles is also provided.

According to still another aspect of the present invention, there is provided an STI (shallow trench isolation) method using the above CMP slurry.

According to yet another aspect of the present invention, there is provided a method for controlling polishing selectivity of an anionically charged material to a cationically charged material, by using a polyelectrolyte salt containing: (a) a mixture of a linear polyelectrolyte having a weight average molecular weight of 2,000~50,000 with a graft type polyelectrolyte that has a weight average molecular weight of 1,000~20,000 and comprises a backbone and a side chain; and (b) a basic material.

Hereinafter, the present invention will be explained in more detail.

The present invention is characterized in that an anionically charged graft type polyelectrolyte having a weight average molecular weight of 1,000~20,000 is used in combination with a linear polyelectrolyte having a weight average molecular weight of 2,000~50,000 during a polishing process in order to efficiently inhibit the structure of a cationically charged material from being polished, while minimizing generation of microscratch caused by abrasive particles.

In general, the surface of a silicon nitride is cationically charged and that of a silicon oxide is anionically charged. Therefore, in order to increase the polishing selectivity of silicon oxide to silicon nitride, an anionically charged polymer, such as a polyelectrolyte, is adsorbed onto the cationically charged silicon nitride via electrostatic force, so that the cationically charged silicon nitride is prevented from being polished, and thus the anionically charged silicon oxide becomes more amenable to polishing.

Herein, if the molecular weight of the anionically charged polymer is too low, the polymer is adsorbed onto the structure of a cationically charged material sparsely or in the form of a thin adsorption layer. Therefore, it is not possible to protect the structure of the cationically charged material sufficiently from the polishing work. To ensure the protection of the cationically charged material during the polishing work, it is preferable that the anionically charged polymer has a high molecular weight. However, if the molecular weight is too high, the polymer is partially adsorbed onto abrasive particles via van der waals force to cause agglomeration of the particles. Furthermore, such agglomerated particles may entail scratches during a CMP process.

Therefore, the present invention is characterized in that in order to maximize the electrostatic adsorption of the anionically charged polymer onto the structure of the cationically charged material, as well as to minimize the adsorption due to the van der waals force, a graft type polyelectrolyte containing a backbone and a side chain is used in addition to a linear polyelectrolyte having a controlled molecular weight. When comparing a graft type polyelectrolyte with a linear polyelectrolyte under the same molecular weight range, a backbone chain length of the graft type polyelectrolyte is shorter than the chain length of the linear polyelectrolyte, so that the graft type polyelectrolyte can minimize an agglomeration phenomenon. Additionally, the graft type polyelectrolyte, which has the side chain grafted to the backbone, can form an adsorption layer on the structure of the cationically charged material with higher polymer density per unit area, to a larger thickness, in proportion to the length of the side chain (see FIG. 2).

In brief, according to the present invention, a graft type polyelectrolyte is used in addition to a linear polyelectrolyte. Thus, the graft type polyelectrolyte can be adsorbed selectively onto the structure of a cationically charged material to a large thickness with no need for increasing its molecular weight. Hence, the structure of the cationically charged material, selectively coated with the graft type polyelectrolyte via electrostatic force, is protected during polishing work, so that the polishing selectivity of the anionically charged material (e.g. silicon oxide) to a cationically charged material (e.g. silicon nitride) can be increased.

Additionally, as compared to an adjuvant using a linear polyelectrolyte alone, the adjuvant comprising a linear polyelectrolyte in combination with a graft type polyelectrolyte shows increased surface protectability, and thus can reduce microscratch generation caused by abrasive particles.

Meanwhile, if the adjuvant according to the present invention is used, it is possible to increase not only the polishing selectivity of the anionically charged material, but also that of a non-charged material. Therefore, a non-charged structure is also included in the scope of the present invention as an equivalent of the anionically charged material.

When using the "linear polyelectrolyte having a weight average molecular weight of 2,000~50,000" as defined herein, polishing selectivity of the structure of an anionically charged material (e.g. silicon oxide) to the structure of a cationically charged material (e.g. silicon nitride) may be 30:1 or higher.

Meanwhile, when using the "graft type polyelectrolyte that has a weight average molecular weight of 1,000~20,000 and comprises a backbone and a side chain" as defined herein, polishing selectivity of the structure of an anionically charged material (e.g. silicon oxide) to the structure of a cationically charged material (e.g. silicon nitride) may be higher than the above polishing selectivity obtained by using the linear polyelectrolyte.

Therefore, when using the "linear polyelectrolyte having a weight average molecular weight of 2,000~50,000" in combination with the "graft type polyelectrolyte that has a weight average molecular weight of 1,000~20,000 and comprises a backbone and a side chain" at an adequate ratio, it is possible to control the polishing selectivity in a range from 50:1 to 100:1.

Preferably, the linear polyelectrolyte used in the present invention is a compound containing a carboxyl group, and particular examples thereof include acrylic acid, methacrylic acid, itaconic acid, maleic acid, or the like.

The linear polyelectrolyte preferably has a weight average molecular weight of 2,000~50,000. If the linear polyelectrolyte has a weight average molecular weight less than 2,000, the polishing rate of a silicon nitride layer increases, resulting in a drop in polishing selectivity. On the other hand, if the linear polyelectrolyte has a weight average molecular weight grater than 50,000, the polishing rate of a silicon oxide layer decreases.

As shown in FIG. 2, the graft type polyelectrolyte that may be used in the present invention is comprised of a backbone 200 and a side chain 201.

According to the present invention, the graft type polyelectrolyte has a weight average molecular weight of 1,000~20,000, and preferably of 3,000~15,000. If the graft type polyelectrolyte has a weight average molecular weight of less than 1,000 or greater than 20,000, a stable slurry composition cannot be obtained. Additionally, if the polyelectrolyte has a weight average molecular weight of greater than 20,000, abrasive particles are agglomerated. Moreover, in the latter case, the polyelectrolyte is adsorbed onto the structure of the anionically charged material (e.g. silicon oxide) as well as onto the structure of the cationically charged material (e.g. silicon nitride), so that the polyelectrolyte serves as a protection layer during the polishing work. Thus, the polishing rate of the structure of the cationically charged material and that of the structure of the anionically charged material decrease at the same time, resulting in reduction of the polishing selectivity.

Preferably, the side chain in the graft type polyelectrolyte preferably has a length corresponding to a molecular weight of 500~2,000, and the backbone in the graft type polyelectrolyte has a length corresponding to a molecular weight of 500~15,000. If the length of the side chain is too short, the polyelectrolyte cannot perform the protection function sufficiently due to the small coating thickness. On the other hand, if the length of the side chain is too long, agglomeration of particles may occur. Additionally, if the length of the backbone is too short, the polyelectrolyte results in poor adsorption. On the other hand, if the length of the backbone is too long, agglomeration of abrasive particles may occur.

The backbone of the polyelectrolyte serves as a major site participating in the electrostatic adsorption. Hence, the backbone preferably contains a large amount of anionic units for the purpose of adsorption onto the structure of the cationically charged material. For example, such anionic units comprise functional groups such as a carboxylic acid group as a part.

The side chain affects the electrostatic adsorption to a lower degree compared to the backbone. Hence, it is not necessary for the side chain to be anionically charged. However, the side chain should not be cationic. The side chain mainly serves to form the adsorption coating layer with a larger thickness.

Preferably, the side chain of the graft type polyelectrolyte comprises a macrounit derived from the polymerization or copolymerization of a hydroxyl group-, carboxyl group- and/or sulfonic acid group-containing ethylenically unsaturated monomer(s). Also, the backbone of the graft type polyelectrolyte comprises a unit derived from a carboxyl group-containing ethylenically unsaturated monomer.

In general, slurry for polishing uses water as a dispersion medium. Hence, it is preferable that the graft type polyelectrolyte is dissolved in water. Thus, it is also preferable that the macrounit forming the side chain of the graft type polyelectrolyte is hydrophilic, and preferably contains units derived from monomers with high affinity to water (for example, hydroxyl group-, carboxyl group-, and/or sulfonic acid group-containing ethylenically unsaturated monomers). The macrounit is a short chain polymer, and is derived from a macromonomer polymerized from 8~16 sub-monomers and end-capped with a functional group. Because if the side chain comprising the macrounit is too long, an agglomeration phenomenon occurs and if the side chain comprising the macrounit is too short, the polyelectrolyte cannot perform the protection function.

The graft type polyelectrolyte used in the present invention may be prepared by using the method as disclosed in Korean Laid-Open Patent No. 2005-0113758, the entire content of which is incorporated herein by reference.

Meanwhile, main monomers used for forming the graft type polyelectrolyte include carboxylic acids such as acrylic acid. However, when such monomers are polymerized by using water, there is a problem in that the reaction mixture for forming the polymer cannot be agitated due to its high viscosity. Moreover, when the solid content of the reaction mixture is reduced to decrease the viscosity, production of the polymer is not advisable in terms of cost-efficiency. Therefore, according to the present invention, when carrying out polymerization of the monomers, an adequate mixture of water with isopropyl alcohol is used to obtain a desired range of molecular weight while maintaining the solid content of the polymerization mixture at about 40%. Additionally, the polymerization is performed at a temperature corresponding to the boiling point of isopropyl alcohol. Further, isopropyl alcohol also functions as a chain transfer agent, and thus is effective for producing a graft type polyelectrolyte having a desired range of molecular weight.

The graft type polyelectrolyte preferably includes an alkoxypolyalkylene glycol mono(meth)acrylate monomer represented by the following Formula 1 at the side chain thereof:

[Formula 1]

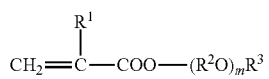

wherein $R^1$ is a hydrogen atom or methyl;

$R^2O$ is a C2~C4 oxyalkylene or a combination thereof, and may be added randomly or in the form of a block when it is a combination of at least two kinds of C2~C4 oxyalkylene groups;

$R^3$ is a C1~C4 alkyl; and m is an average addition mole number of oxyalkylene groups, and represents an integer of 1~50.

Particularly, the alkoxypolyalkylene glycol mono(meth) acrylate monomer is contained in the polyelectrolyte in an amount of 10~50 wt %. If the monomer is contained in an amount less than 10 wt %, it is difficult to obtain high selectivity, which is otherwise obtained from a graft type polyelectrolyte. If the monomer is contained in an amount higher than 50 wt %, a final slurry composition using a high-selectivity additive comprising the same may show the problem of increased air bubble generation.

According to the present invention, each of the linear polyelectrolyte, the graft type polyelectrolyte and a mixture thereof may be converted into a polyelectrolyte salt by using a basic material in an aqueous phase. Also, the scope of the present invention may include polyelectrolyte types other than a polyelectrolyte salt.

The polyelectrolyte salt according to the present invention has a pH of 4.5~8.8, and preferably of 6.0~8.0. If the pH is less than 4.5 or greater than 8.8, it is not possible to obtain a sufficient level of polishing selectivity.

When the adjuvant of the present invention is used in CMP slurry, the basic materials that may be used include at least one material selected from the group consisting of ammonium hydroxide ($NH_4OH$) and basic amines, such as tetramethylammonium hydroxide, tetraethylammonium hydroxide, tetrapropylammonium hydroxide and tetrabutylammonium hydroxide. Such basic materials may be used alone or in combination.

In addition to the above-described adjuvant, the present invention also provides CMP slurry, which comprises: (i) an adjuvant comprising (a) a mixture of a linear polyelectrolyte having a weight average molecular weight of 2,000~50,000 with a graft type polyelectrolyte that has a weight average molecular weight of 1,000~20,000 and comprises a backbone and a side chain, and (b) a basic material; (ii) abrasive particles; and (iii) water.

The adjuvant is used in the CMP slurry preferably in an amount of 0.1~10 wt %. If the amount is less than 0.1 wt %, the polishing rate of a silicon nitride layer increases to reduce the polishing selectivity, and a dishing phenomenon occurs during polishing of a patterned wafer. On the other hand, if the amount is greater than 10 wt %, the polishing rate of a silicon oxide layer decreases, resulting in an increase in processing time and a drop in polishing selectivity.

The abrasive particles are used in the CMP slurry in an amount of 0.1~10 wt %. If the amount is less than 0.1 wt %, high removal rate of oxide layer cannot be achieved sufficiently. On the other hand, if the amount is greater than 10 wt %, the slurry shows poor stability.

As the abrasive particles, nano-sized ceramic abrasive particles, such as silica, alumina, zirconia, titania or cerium oxide particles may be used. Preferably, cerium oxide particles are used.

The CMP slurry may be prepared by using the polyelectrolyte salt dissolved in a solvent (e.g. water), and the abrasive particles dispersed in a dispersion medium (e.g. water). Preferably, the aqueous solution of the polyelectrolyte salt has a concentration of 3~3.5 wt %, and the water dispersion of the abrasive particles has a concentration of 4~6 wt %.

Therefore, the water forming the CMP slurry may come from the water present in the composition containing the polyelectrolyte salt or abrasive particles. Water is used in such an amount as to adjust the total weight of the slurry to 100 wt %. Preferably, water is used in an amount of 94~99.8 wt %. If the amount is less than 94 wt %, the slurry is degraded in terms of stability. If the amount is greater than 99.8 wt %, the polishing rate is degraded.

Further, the present invention provides an STI (shallow trench isolation) method using the CMP slurry.

When the CMP slurry according to the present invention is used, it is possible to remove the SiN layer uniformly over the whole range of a wafer during a CMP process, due to a high selectivity of the silicon oxide layer to the silicon nitride layer. Hence, it is possible to minimize variations in the thickness. As a result, there is little difference between the levels of the active regions and those of the field regions, while not adversely affecting the quality of the transistor and the microelectronic device. Additionally, the slurry composition can minimize generation of microscratch during the CMP work. Therefore, the present invention may be applied suitably to the manufacture of very large-scale integrated semiconductor devices requiring a micropattern, thereby improving the reliability and productivity.

Further, the present invention provides a method for controlling polishing selectivity of an anionically charged material to a cationically charged material by using a mixture of a linear polyelectrolyte having a weight average molecular weight of 2,000~50,000 with a graft type polyelectrolyte that has a weight average molecular weight of 1,000~20,000 and comprises a backbone and a side chain.

For example, according to the present invention, it is possible to control the polishing selectivity in a range of 50:1~100:1 by using the "linear polyelectrolyte having a weight average molecular weight of 2,000~50,000" suitably in combination with the "graft type polyelectrolyte that has a weight average molecular weight of 1,000~20,000 and comprises a backbone and a side chain."

MODE FOR CARRYING OUT THE INVENTION

Figure 1:
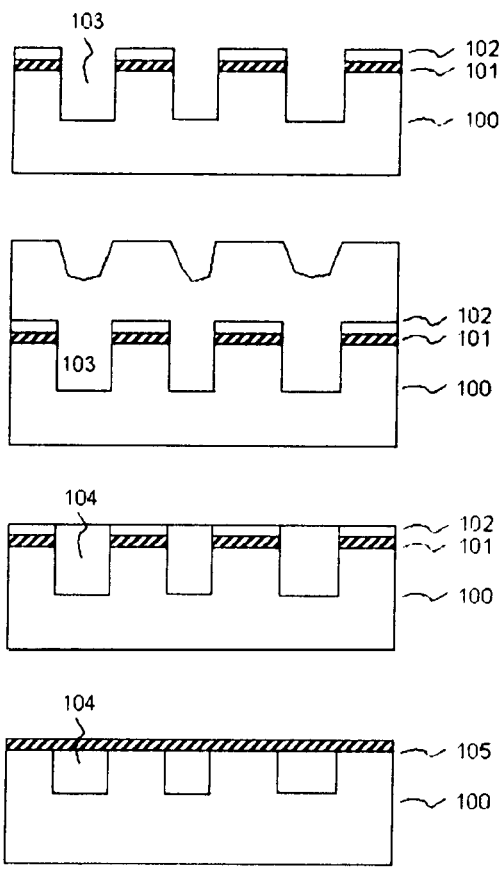
FIG. 1 is a flow chart illustrating a conventional STI (shallow trench isolation) process.
Figure 2:
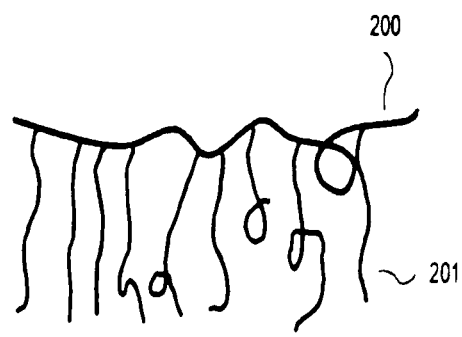
FIG. 2 is a schematic view showing the structure of a graft type polyelectrolyte according to a preferred embodiment of the present invention.

Reference will now be made in detail to the preferred embodiments of the present invention. It is to be understood that the following examples are illustrative only and the present invention is not limited thereto.

Preparation Example 1

Preparation of Linear Polyelectrolyte

To a 2 L glass reactor equipped with a thermometer, a stirrer, a dropping funnel, a nitrogen inlet tube and a reflux condenser, 160 parts by weight of distilled water and 240 parts by weight of isopropyl alcohol were introduced, the reactor was purged with nitrogen under stirring, and the reaction mixture was heated to 80° C. under nitrogen atmosphere.

To the reactor, an aqueous monomer solution containing 300 parts by weight of acrylic acid mixed with 250 parts by weight of distilled water and 90 parts by weight of an aqueous solution containing 9.7 wt % of ammonium peroxide as an initiator were added dropwise over 3 hours. After the completion of the addition, the reaction mixture was aged while maintaining the temperature at 80° C. for 2 hours to complete the polymerization.

After the polymerization, isopropyl alcohol and distilled water were extracted from the reaction mixture while increasing the pressure gradually from ambient pressure to 100 torrs over 2~3 hours. Then, the reaction mixture was cooled to room temperature, and neutralized with 29 wt % of aqueous ammonia for 1 hour to obtain a linear polyelectrolyte salt.

The linear polyelectrolyte salt was shown to have a weight average molecular weight of 15,239 as measured by gel permeation chromatography (GPC).

Preparation Example 2

Preparation of Graft Type Polyelectrolyte

An acrylic acid-methoxypolyethylene glycol monomethacrylate graft type polyelectrolyte was prepared in the same manner as described in Preparation Example 1, except that the aqueous monomer solution was comprised of 210 parts by weight of acrylic acid and 90 parts by weight of methoxypolyethylene glycol monomethacrylate (average addition mole number of ethylene oxide groups: 6 moles), instead of 300 parts by weight of acrylic acid.

The graft type polyelectrolyte had a weight average molecular weight of 17,896.

Example 1

(Preparation of Adjuvant for CMP Slurry)

First, 100 parts by weight of the linear polyelectrolyte obtained from Preparation Example 1 was mixed with 0 parts by weight of the graft type polyelectrolyte obtained from Preparation Example 2, and the mixture was diluted with water to a concentration of 3 wt %. Then, ammonium hydroxide as a basic material was added to the solution of polyelectrolytes to a pH 7.0~8.0 to provide an adjuvant for CMP slurry.

(CMP Slurry)

CMP slurry was prepared by mixing the adjuvant for CMP slurry obtained as described above, abrasive particle composition and water in a volume ratio of 1:3:3. Then, pH of the slurry was adjusted to about pH 7.5~8.0.

Examples 2~7

An adjuvant for CMP slurry and CMP slurry comprising the same were provided in the same manner as described in Example 1, except that the linear polyelectrolyte and the graft type polyelectrolyte were mixed in the ratio as shown in the following Table 1.

TABLE 1

|  | Linear Polyelectrolyte | Graft type Polyelectrolyte |
|---|---|---|
| Ex. 1 | 100 parts by weight | 0 parts by weight |
| Ex. 2 | 90 parts by weight | 10 parts by weight |
| Ex. 3 | 75 parts by weight | 25 parts by weight |
| Ex. 4 | 50 parts by weight | 50 parts by weight |
| Ex. 5 | 25 parts by weight | 75 parts by weight |
| Ex. 6 | 0 parts by weight | 100 parts by weight |

Comparative Example 1

CMP slurry was provided in the same manner as described in Example 1, except that no adjuvant for CMP slurry was used.

Comparative Example 2

An adjuvant for CMP slurry and CMP slurry using the same were provided in the same manner as described in Example 1, except that HS8005-GP (PAA-based linear polyelectrolyte) available from Hitachi Co. (Japan) was used, instead of the linear polyelectrolyte as used in Example 1.

Experimental Example

The CMP slurries obtained from Examples 1~6, and Comparative Examples 1 and 2 were evaluated for the polishing quality. For the test, a CMP apparatus, POLI-400 available from GnP Technology was used. The wafers to be polished included an oxide wafer on which a silicon oxide layer was deposited to a thickness of 7,000 Å and a nitride wafer on which a silicon nitride layer was deposited to a thickness of 1,500 Å. The polishing test was performed under the conditions as shown in the following Table 2.

TABLE 2

| Pad | ICI400(Rodel, USA) |
|---|---|
| Wafer thickness measurement | Nanospec6100 (Nanometerics,USA) |
| Head speed | 90 rpm |
| Spindle speed | 90 rpm |
| Down force | 4 psi |
| Back pressure | 0 psi |
| Slurry feed rate | 100 Ml/min |

Under the above conditions, CMP was carried out by using the CMP slurry obtained from Examples 1~6, and Comparative Examples 1 and 2 for 1 minute. Then, thickness variations after the polishing, polishing rates and polishing selectivity were measured. The results are shown in the following Table 3.

TABLE 3

|  | Polishing rate of oxide layer (Å/min) | WIWNU (%) | Polishing rate of nitride layer (Å/min) | Polishing selectivity |
|---|---|---|---|---|
| Ex. 1 | 4244 | 2.99 | 68 | 62:1 |
| Ex. 2 | 4234 | 3.58 | 67 | 63:1 |
| Ex. 3 | 4268 | 2.89 | 64 | 67:1 |
| Ex. 4 | 4380 | 3.48 | 59 | 74:1 |
| Ex. 5 | 4518 | 2.78 | 55 | 82:1 |
| Ex. 6 | 4541 | 2.79 | 50 | 91:1 |
| Comp. Ex. 1 | 5241 | 5.92 | 957 | 5:1 |
| Comp. Ex. 2 | 4182 | 7.34 | 71 | 59:1 |

[Note]
WIWNU(Within Wafer Non-Uniformity) - a value obtained by dividing the standard deviation in wafer thickness after polishing by the average wafer thickness. A lower WIWNU indicates a higher planarization degree.

As can be seen from Table 3, the CMP slurry obtained by using the adjuvant for CMP slurry comprising a mixture of a linear polyelectrolyte with a graft type polyelectrolyte according to Examples 1~6 provides a higher polishing rate of an oxide layer and a lower polishing rate of a nitride layer, as compared to Comparative Example 1, and thus provides an increased polishing selectivity.

Meanwhile, as can be seen from the results of Examples 1~6 in Table 3, it is possible to control the polishing selectivity by controlling the ratio of the linear polyelectrolyte to the graft type polyelectrolyte.

INDUSTRIAL APPLICABILITY

As can be seen from the foregoing, when the adjuvant for CMP slurry according to the present invention, which comprises a mixture of a linear polyelectrolyte with a graft type polyelectrolyte is applied to a CMP process, it is possible to reduce generation of microscratches caused by abrasive particles, and to increase polishing selectivity as compared to CMP slurry using the linear polyelectrolyte alone. Additionally, it is possible to obtain a desired range of polishing selectivity by controlling the ratio of the linear polyelectrolyte to the graft type polyelectrolyte.

While this invention has been described in connection with what is presently considered to be the most practical and preferred embodiment, it is to be understood that the invention is not limited to the disclosed embodiment and the drawings. On the contrary, it is intended to cover various modifications and variations within the spirit and scope of the appended claims.

The invention claimed is:

1. An adjuvant for CMP (chemical mechanical polishing) slurry, which comprises a polyelectrolyte salt containing:
   (a) a mixture of a linear polyelectrolyte having a weight average molecular weight of 2,000~50,000 with a graft type polyelectrolyte that has a weight average molecular weight of 1,000~20,000 and comprises a backbone and a side chain; and
   (b) a basic material,
   wherein the graft type polyelectrolyte includes an alkoxypolyalkylene glycol mono(meth)acrylate monomer represented by the following Formula 1 at the side chain thereof:

[Formula 1]

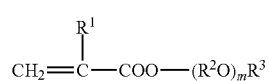

wherein $R^1$ is a hydrogen atom or methyl;
$R^2O$ is a C2~C4 oxyalkylene or a combination thereof, and may be added randomly or in the form of a block when it is a combination of at least two kinds of C2~C4 oxyalkylene groups;
$R^3$ is a C1~C4 alkyl; and
m is an average addition mole number of the C2~C4 oxyalkylene groups, and represents an integer of 1~50.

2. The adjuvant according to claim 1, wherein the alkoxypolyalkylene glycol mono(meth)acrylate monomer is present in an amount of 10~50 wt % based on the weight of the graft type polyelectrolyte.

3. CMP (chemical mechanical polishing) slurry comprising:
   (a) the adjuvant as defined in claim 1;
   (b) abrasive particles; and
   (c) water.

4. An STI (shallow trench isolation) method using the CMP slurry as defined in claim 3.

* * * * *